United States Patent [19]
Quinn et al.

[11] Patent Number: 5,753,959
[45] Date of Patent: May 19, 1998

[54] REPLACING SEMICONDUCTOR CHIPS IN A FULL-WIDTH CHIP ARRAY

[75] Inventors: Kraig A. Quinn; Brian T. Ormond, both of Webster; Josef E. Jedlicka, Rochester, all of N.Y.

[73] Assignee: Xerox Corporation, Stamford, Conn.

[21] Appl. No.: 779,045

[22] Filed: Jan. 6, 1997

Related U.S. Application Data

[62] Division of Ser. No. 416,127, Apr. 3, 1995.

[51] Int. Cl.$^6$ .................................................. H01L 31/00
[52] U.S. Cl. .............................................. 257/443; 257/723
[58] Field of Search ............................. 257/91, 443, 723, 257/618; 250/280.1; 358/503

[56] References Cited

U.S. PATENT DOCUMENTS

4,860,075 8/1989 Araghi et al. .................. 357/30

Primary Examiner—Tom Thomas
Assistant Examiner—Roy Potter
Attorney, Agent, or Firm—R. Hutter

[57] ABSTRACT

Semiconductor chips, such as photosensor arrays for a full-page-width scanner or printhead chips for a full-page-width ink-jet printer, are mounted on a substrate to maintain reasonably consistent spacing among adjacent chips. To remove a defective chip from the array, the substrate is urged evenly against a work surface defining a convex bow. Alternately, back-cuts are provided along abutting edges of the chips, and the silicon around these back-cuts can be sawed away to space defective chips from neighboring good chips. By increasing the spacing of a defective chip from neighboring chips, the defective chip can be removed while minimizing the risk of damage to neighboring chips. Also, batches of chips can be originally manfactured on a single wafer as either "regular" chips or "replacement" chips, with the replacement chips being slightly shorter in a critical dimension.

7 Claims, 6 Drawing Sheets

REPLACING SEMICONDUCTOR CHIPS IN A FULL-WIDTH CHIP ARRAY

This application is a division of application Ser. No. 08/416,127, filed Apr. 3, 1995.

The present invention relates generally to semiconductor chips which are mounted on a substrate. In particular, the present invention relates to a method whereby semiconductor chips mounted on a substrate can be selectably removed and replaced for repair purposes.

Image sensors for scanning document images, such as charge coupled devices (CCDs), typically have a row or linear array of photosites together with suitable supporting circuitry integrated onto a silicon chip. Usually, a sensor is used to scan line by line across the width of a document with the document being moved or stepped lengthwise in synchronism therewith. A typical architecture for such a sensor array is given, for example, in U.S. Pat. No. 5,153,421.

In a full-page-width image scanner, there is provided a linear array of small photosensors which extends the full width of an original document, such as 11 inches. These photosensors may be spaced as finely as 600 to the inch on each chip. When the original document moves past the linear array, each of the photosensors converts reflected light from the original image into electrical signals. The motion of the original image perpendicular to the linear array causes a sequence of signals to be output from each photosensor, which can be converted into digital data.

A currently-preferred design for creating such a long linear array of photosensors is to provide a set of relatively small semiconductor chips, each semiconductor chip defining thereon a linear array of photosensors along with ancillary circuit devices. These chips are typically approximately ¾ inches in length; in order to create a practical full-page-width array, as many as twenty or more of these chips can be abutted end-to-end to form a single linear array of photosensors. The abutted chips are typically mounted on a support platform. This support platform also includes circuitry, such as on a printed wire board, which accesses the circuit devices on the individual chips for a practical system. The interconnections between the relatively large-scale conductors on the printed wire board and the relatively small contact pads on the semiconductor chips are preferably created by wire bonds which are ultrasonically welded to both the printed wire board conductors and to contact pads on the chips.

In a scanning system, the image resolution is proportional to the ratio of the scan width and the number of array photosites. Because of the difficulty in economically designing and fabricating an array of photosites comparable in length to the width of an image, optical reduction of the scan line to a length considerably shorter than the actual width of the image is fairly common in scanners and facsimile machines currently available. Because of the optical reduction, image resolution typically available today is relatively low when used to scan a full line. A long or full-width array having a length equal to or larger than the document line and with a large packing of co-linear photosites to assure high resolution has been and remains a very desirable but difficult aim. In the pursuit of a long or full-width array, forming the array by assembling several small chips together end to end has often been postulated. However, the need, which is critical, to provide chips with photosites extending to the border or edge of the chip, so as to assure continuity when the set of chips are assembled into a full-width array, and at the same time provide edges that are sufficiently smooth and straight to be assembled together without loss of image data, has proven to be a formidable obstacle. Although the standard technique of scribing and cleaving silicon wafers used by the semiconductor industry for many years produces chips having reasonably controlled dimensions, the microscopic damage occurring to the chip surface during the scribing operation effectively precludes the disposition of photosites at the chip edge. Various techniques have been proposed in the prior art for cleaving wafers into chips in a manner that preserves the accuracy of dimensions and avoids damage to the chips. One example of such a technique, incorporating the chemical etching of V-shaped grooves prior to the sawing step, is shown in U.S. Pat. No. 4,814,296.

In the construction of high-precision imaging equipment, such as full-page-width sensor bars and/or ink-jet printheads, a source of great expense relates to the "yield rate" of the component chips as they are first manufactured. In certain applications of photosensor chips, for example, a typical yield rate is only about 75%; that is, with every batch of chips created from a silicon wafer, it is not unusual to have 25% of the chips found unsatisfactory for installation in a chip array. Significantly, it is also not unusual to detect fatal flaws in a particular chip after the chip has been installed in the chip array. If such a flaw in an installed chip is discovered, it is desirable not to have to discard the entire chip array for the sake of one defective chip. It is preferable to provide a design by which individual unsatisfactory chips may be removed from an array and replaced.

One practical problem with replacing individual chips in a preexisting chip array is that removal of the chip, such as by heat or pressure, may require the bar as a whole to be subjected to conditions which could damage other chips in the chip array which are perfectly functional. It is therefore desirable to provide a technique for removing a selected one unsatisfactory chip from a chip array in a manner which minimizes the potential for damage to neighboring chips.

In the prior art, U.S. Pat. No. 3,811,186 discloses a method for aligning and supporting micro-circuit devices on substrate conductors, in which shaped, flexible, insulative material is placed between the devices and their respective conductors to support heat fusible terminals of the devices in alignment with mating conductor lands.

U.S. Pat. No. 5,093,708 discloses a multilayer integrated circuit module for supporting integrated circuit chips and interfacing the chips to external circuitry. Each integrated circuit includes conductive contact pads disposed upon beveled edges. Beveled side edges formed in the circuit module support the integrated circuit chips upon the beveled surfaces thereof.

U.S. Pat. No. 5,258,330 discloses a semiconductor chip having contact on the top surface thereof and including an interposer overlying the central portion of the top surface. Peripheral contact leads extend inwardly from the peripheral contact to central terminals on the interposer. The leads and interposer are flexible so that the terminals are movable with respect to the contacts on the chip, to compensate for thermal expansion of the chip and substrate.

U.S. Pat. No. 5,272,113 discloses a method for making a photosensor array comprising a plurality of abutting silicon chips. After chips are tacked onto a substrate with uncured epoxy, the assembly is brought to a low temperature prior to the heating of the curing step.

U.S. Pat. No. 5,318,926 discloses a method of re-configuring a plastic package so that an integrated circuit chip can be installed therein. A pre-molded plastic package is abraded over a die attach pad. A new chip is then mounted onto the mounting pad and new wire bonds are connected between the new chip and the lead frame.

U.S. Pat. No. 5,286,679 discloses a method for attaching a semiconductor die to a lead frame, comprising the steps of forming a pattern adhesive layer on a semiconductor wafer prior to singulation of the dies from the wafer. The adhesive layer is patterned such that wire bonding pads on the dies, as well as the streets between the dies, are free of adhesive material.

According to the present invention, there is provided a chip array for use in imaging apparatus, such as a photosensor array, light-emitting diode array, or an ink-jet printhead. There is provided a substrate, with a plurality of semiconductor chips attached thereto. Each semiconductor chip includes on a main surface thereof an equal number of repetitive structures arranged in a linear array extending along a main dimension. One of the plurality of semiconductor chips is of a first type, wherein the repetitive structures arranged in the linear array define a first total length. One of the plurality of semiconductor chips in the array is of a second type, wherein the repetitive structures arranged in the linear array define a second total length which is shorter than the first total length.

According to another aspect of the present invention, there is provided a semiconductor wafer, defining a plurality of functionally identical chip circuit sets in discrete chip areas thereof, the chip areas being defined along at least two opposing borders thereof by an etched groove. A first chip area is defined by two opposing etched grooves spaced by a first predetermined length, and a second chip area is defined by two opposing etched grooves spaced by a second predetermined length shorter than the first predetermined length.

Figure 1:
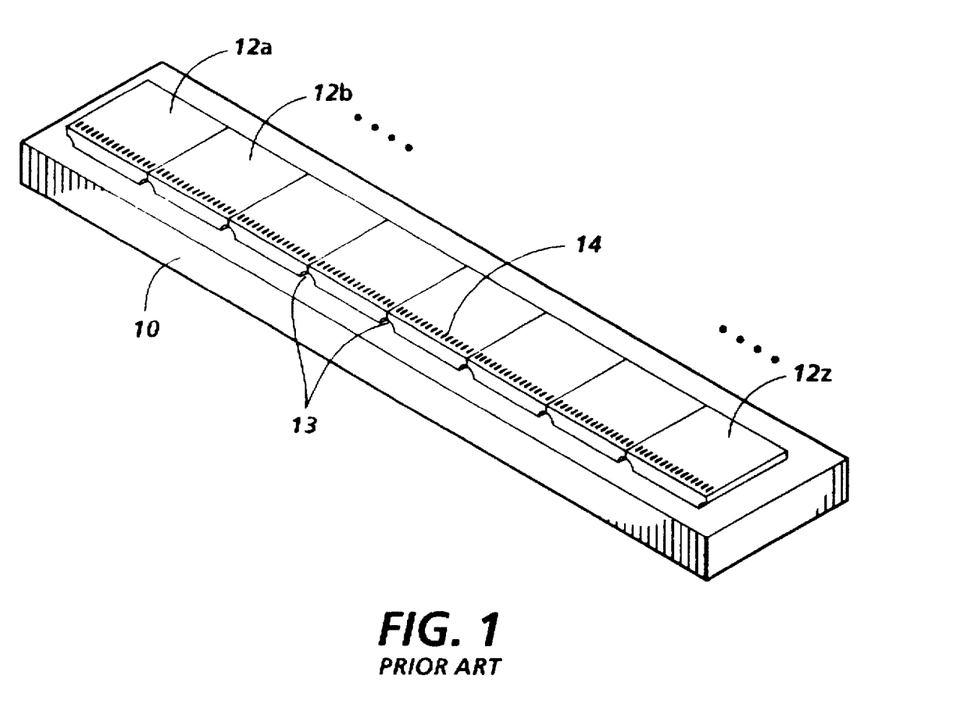
FIG. 1 is a perspective view of a chip array, such as would be used in a full-page-width photosensor array or ink-jet printhead, wherein abutted silicon chips are attached to a substrate.

FIG. 1 shows a substrate 10 having a plurality of butted silicon chips 12a, 12b, . . . 12z mounted thereon. Although the chips 12a–12z shown in the Figure are not specified as to function, it will be understood that they each may represent a portion of a CCD, another type of photosensitive semiconductor chip, an LED (light-emitting diode) print bar, a chip relating to thermal ink-jet technology, or any other purpose in which a series of semiconductor chips are required to be arranged in butted fashion. At the side interfaces between adjacent chips 12 on the substrate 10, are preferably formed back-cuts 13. Back-cuts 13 are open-ended grooves disposed adjacent the surface of substrate 12, and serve to provide narrow cavities between the adjacent chips and the substrate 10. Such back-cuts are shown, for example, in U.S. Pat. No. 4,814,296. In one typical application of butted chips on a substrate, the chips 12a–12z are of a thickness of approximately 17 mils, with back-cuts at the edges thereof so that the thickness of each chip in the area of a back-cut is about 6 mils. The cavities formed by back-cuts 13 are useful, among other reasons, for receiving excess quantities of epoxy placed on the substrate 10 and pressed out from under the chips in the array assembly process, as will be explained below.

Also defined on each chip 12a, 12b, . . . 12z is a set of repetitive structures 14. As used herein, "repetitive structure" relates to any regularly-spaced devices or structures on each chip which form a regular pattern. These structures may be, by way of example and not limitation, photosites in a CCD, LED's, or capillary channels or resistors in portions of thermal ink-jet printheads. As mentioned above, the regular spacing of such repetitive structures is usually crucial to maintain on a chip-to-chip basis, particularly in the gaps between adjacent chips.

For most semiconductor applications, the most common primary material for chips 12a–12z is crystalline silicon. A preferred substance for forming substrate 10 is the board sold under the tradename CERACOM, made by Ibiden Corporation of Japan, which generally comprises a ceramic core with a fiberglass resin laminate thereon. Another material suitable for substrate 10 includes the printed wire board material known as "FR-4," or a relatively thin substrate of alumina.

Figure 2:
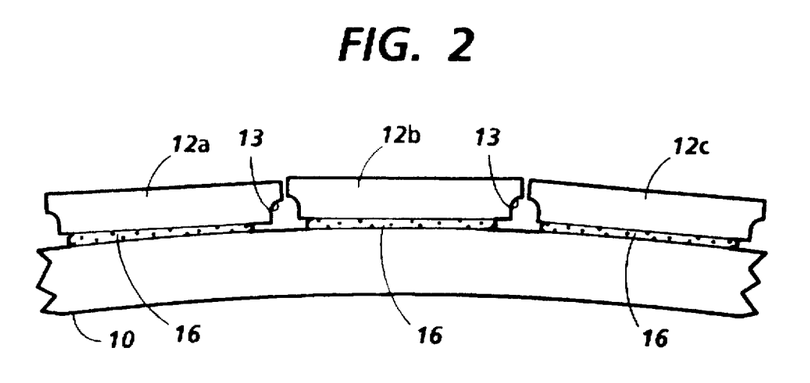
FIG. 2 is an elevational view of a chip array, wherein the substrate is urged against a work surface having a convex bow.

FIG. 2 is a detailed elevational view of the chip array shown in FIG. 1, illustrating a technique for removing a selected semiconductor chip, such as 12b, according to the method of the present invention. As can be seen in the detailed elevational view, each representative chip here illustrated as 12a, 12b, and 12c is attached to the substrate 10 by an individual bead 16 of an adhesive such as epoxy. Because the adhesive beads 16 are discontinuous along the array of chips, there is preferably little or no residual adhesive between adjacent chips, particularly in the areas of back-cuts 13.

It will be noted in FIG. 2 that, as part of the chip-removal process, the substrate 10 is slightly bent in a convex manner with the surface of substrate 10 holding the chips 12 thereon in tension and the opposite surface thereof in compression. This convex bending can be accomplished, for example, by urging the substrate 10 evenly against a work surface (not shown) causing the substrate 10 to conform to a convex shape, as shown. Alternately, it is conceivable that substrate 10 could be urged at the ends thereof, such as by clamping, in order to obtain the desired convex bending.

The purpose of the convex bending, according to the method of the present invention, is to increase the spacing between adjacent chips 12. As shown in FIG. 2, this convex bending will cause the distance between the top corners of adjacent chips to increase, particularly around what are shown as the top surfaces of the chips 12 in the elevational view of FIG. 2. This extra spacing between adjacent chips which is created by the bending enables a single selected chip 12 to be removed while minimizing the chance of damaging neighboring chips in the removal process.

Figure 3:
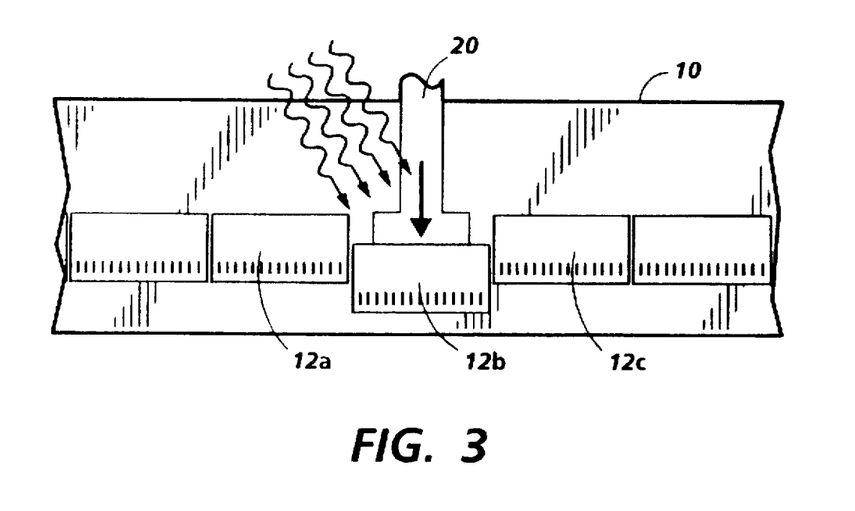
FIG. 3 is a plan view of the chip array, showing a chip being removed from the substrate.

FIG. 3 is a plan view of the portion of the chip array shown in FIG. 1, showing how a selected chip, here indicated as 12b, can be removed from the substrate 10 by any number of familiar physical techniques for removing epoxy-bound member from another. In the specific case shown in FIG. 3, the chip 12b is being removed from substrate 10 by lateral urging parallel to the surface of substrate 10, by a tool such as indicated by 20; this urging may be combined with a heat application to release the adhesive as well. The convex bending of the substrate 10, as shown in FIG. 2, provides an extra measure of separation between the chip being removed and its neighboring chips, thus lowering the possibility of damage to neighboring chips such as 12a and 12c.

Figure 4:
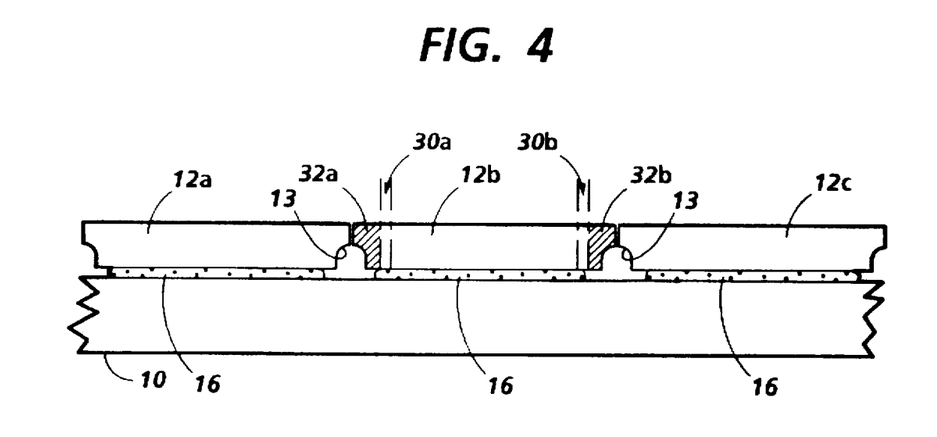
FIG. 4 is an elevational view of a chip array, showing a step according to one aspect of the present invention.

FIG. 4 is another detailed elevational view of a portion of the chip array as shown in FIG. 1, illustrating an alternate technique for removing a selected one chip from the chip array. The technique illustrated in FIG. 4 may be used by itself, or in combination with the substrate-bending technique described in relation to FIG. 2 above. As shown in FIG. 4, a series of chips 12a, 12b, 12c are attached by individual epoxy beads 16, in such a manner as to minimize the amount of any excess adhesive in the areas corresponding to back-cuts 13 between adjacent chips. According to the technique of FIG. 4, two saw-cuts, hereshown as 30a and 30b, are made in the semiconductor chip 12b which is desired to be removed. Preferably, the saw-cuts 30a and 30b are made relatively close to the back-cuts 13 of the chip 12b to effectively cut off the portions of the chip 12b immediately adjacent the back-cuts 13.

Figure 5:
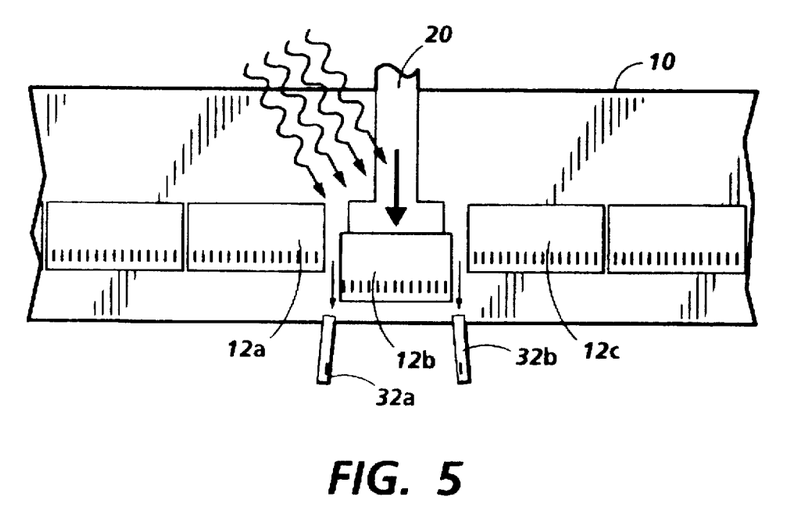
FIG. 5 is a plan view of the chip array, showing a chip being removed from the substrate.

Because of the lack of adhesive material attaching the portion of the chip 12b near the back-cut 13 to the substrate 10, the cut-off portion at the edges of the chip 12b will simply be loose after the cutting process. These loose portions of the chip 12b are shown as portions 32a and 32b. The saw-cuts 30a and 30b are typically made by a diamond blade of a predetermined thickness which will yield the desired removal of the loose portions 32a and 32b. The loose portions can be brushed or blown away, leaving only the central portion of chip 12b. This remainder of the chip 12bis well spaced from either of the neighboring chips 12a or 12c, and can thus be removed by techniques such as heat and/or pressure with low risk of damaging neighboring chips. FIG. 5 shows a top view of the process of removing the chip 12b from the chip array, also showing that the loose portions 32a, 32b can simply be pushed aside prior to the process of removing the "rump" of chip 12b such as by heat and/or pressure tool 20.

In setting up a manufacturing process by which a relatively large number of chips 12 are created in a single wafer which is subsequently diced into individual chips, it is desirable that the inevitability of having to replace chips after they are installed in a chip array can be taken into account at the wafer design stage. Chips that are used to replace chips which have been removed from the pre-existing chip array are preferably made slightly smaller than the basic chips in the critical chip-to-chip dimension. That is, after a defective chip has been removed from a chip array, it is desirable to replace the removed chip with a replacement chip which is otherwise functionally identical to the other chips in the chip array (i.e., has the same number of photosensors and associated circuitry), but which significantly is pre-designed to be slightly shorter in length. Of course, because of any repetitive structures such as a linear array of photosensors or portions of ink-jet ejectors, the replacement chips cannot be significantly shorter than the regular chips, to the extent that the shorter length would affect the proper placement of the repetitive structure in the longer array.

Figure 6:
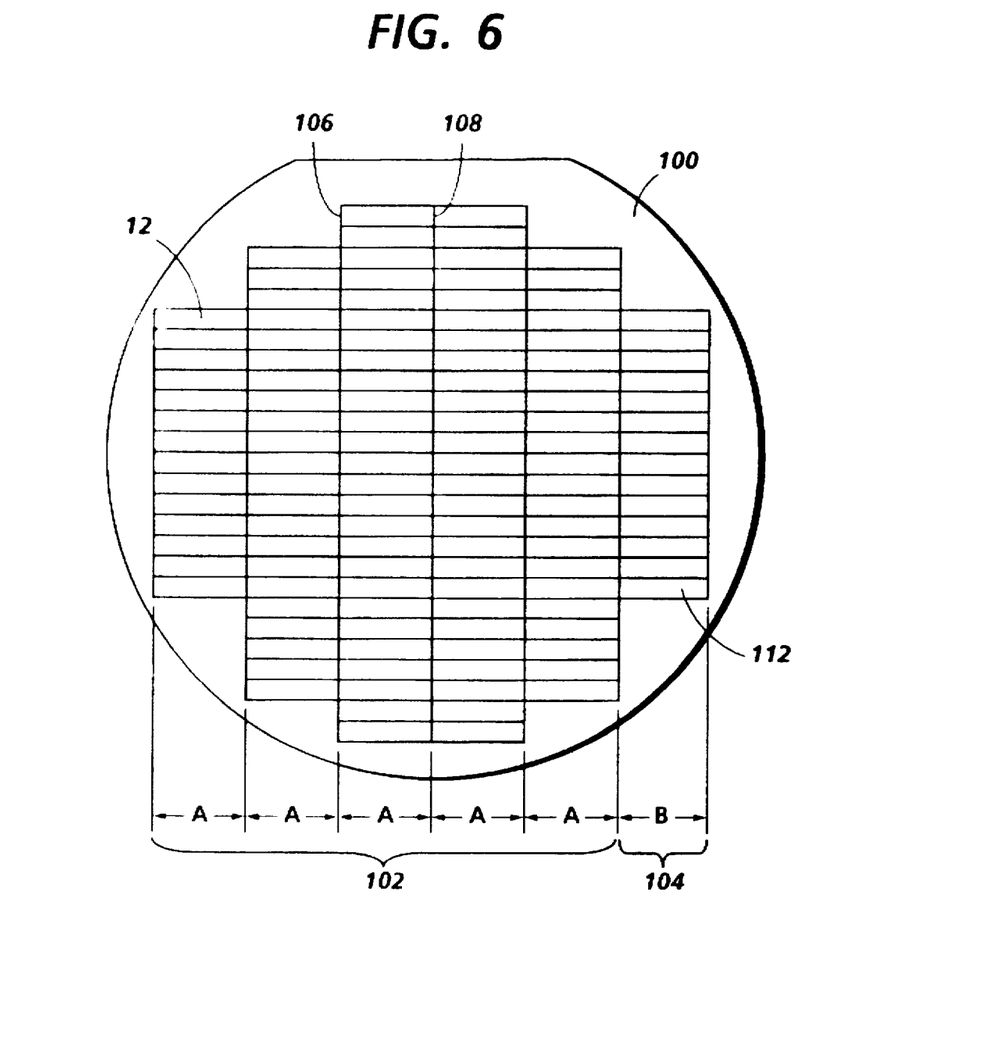
FIG. 6 is a plan view showing a wafer made according to a technique of the present invention.

FIG. 6 is a plan view showing a silicon wafer 100, in which circuit sets corresponding to a plurality of substantially identical chips are formed, by known means, for eventual dicing into individual substantially identical chips. As used in the claims herein, a "circuit set" is defined as a set of circuitry having a predetermined function, such as providing a certain number of photosensors with associated circuitry, or else portions of a certain numbers of portions of ink-jet ejectors in an ink-jet printhead. A typical wafer will include circuit sets for a first set of chips 12 which are collectively shown in the chip as set 102, and also a set of circuit sets indicated as 104 comprising a number of chips 112. According to the present invention, the chips 112 in set 104 are functionally identical to chips 12 in set 102, with the significant difference that the chips 112 are designed to be slightly shorter in the effective length thereof than the chips 12. Taking one example with photosensor chips, a typical length 12 along the linear array of photosites thereof is 15.748 mm (length A as shown in the Figure); the slightly shorter chips 112 are intended to have an effective length of 15.743 mm (length B as shown in the Figure). When the various chip sets corresponding to chips 12 and 112 are formed on the original wafer 100, these lengths are defined by the presence of etched V-grooves which define the effective ends of an individual chip. Grooves 106 or 108 in the wafer 100 are intended to define the effective edges of the chip, and also serve as locations where a cutting blade, such as a diamond blade, cuts the wafer 100 to form individual chips.

The relative number of short chips 112 to longer chips 12 in a wafer 100 can be chosen based on an empirical study of how many chips are typically required to be replaced after installation in a chip array.

Figure 7A:
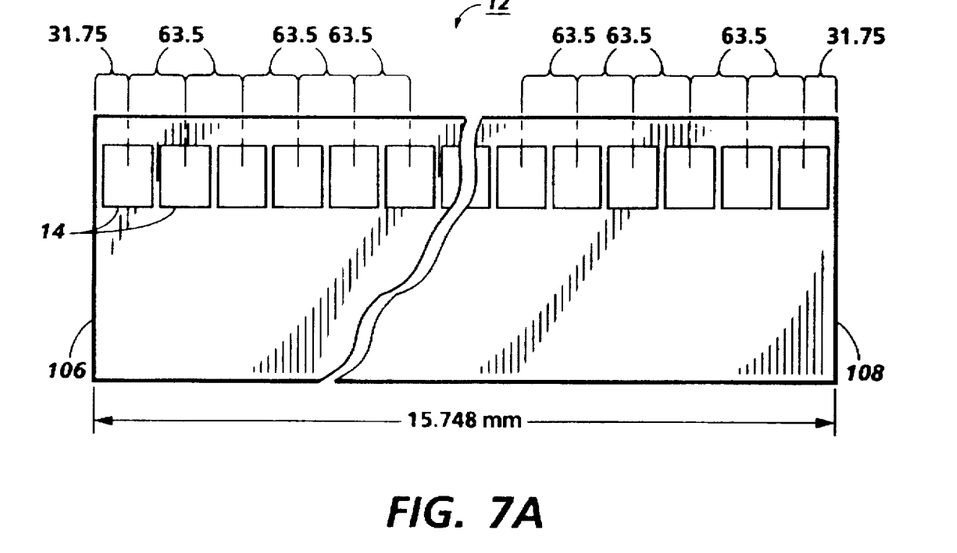
FIGS. 7A and 7B are plan views, respectively, of relatively long chips and short chips as made according to one aspect of the present invention.
Figure 7B:
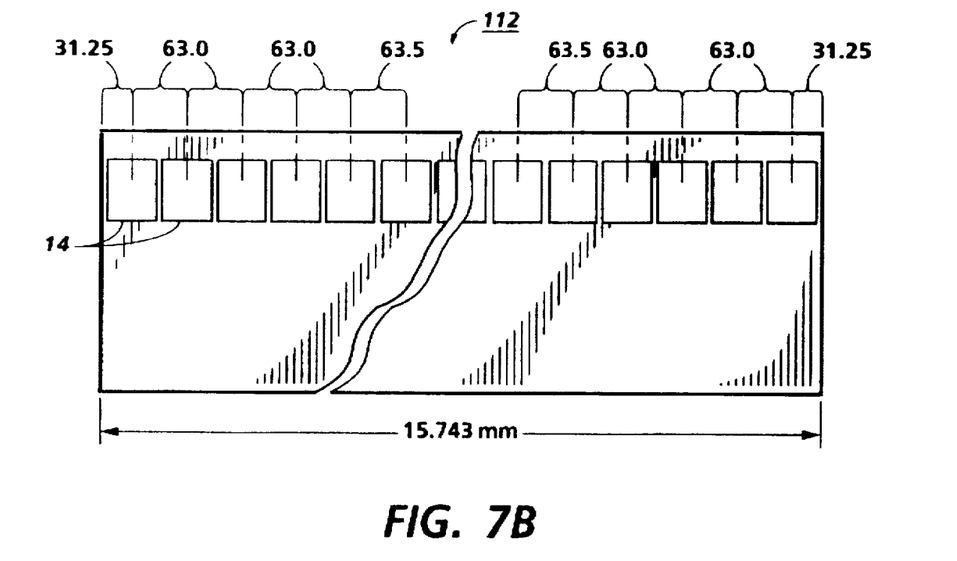

FIGS. 7A and 7B are plan views, respectively, of representative chips 12 and 112 according to the present invention. In each case, there is provided on the chip 248 repetitive structures, in this case photosites, which are here for the most separated by a pitch of 63.5 micrometers. In the basic full-length chip 12, shown in FIG. 7A, each of the photosites 14 are separated through the centers thereof by 63.5 micrometers throughout the entire length of the chip 12, with the end photosites in the linear array being spaced from the edge of the chip by one-half of the pitch, or 31.75 micrometers. This arrangement of repetitive structures 14 will generally maintain an even pitch spacing even when a plurality of chips 12 are butted together to form a full-width array: the short pitch at the end photosites will add up to the same 63.5 micrometer pitch relative to end photosites of adjacent chips.

For the shorter chip 112 shown in FIG. 7B, there are also provided 248 photosites between the edges, but, significantly, the last five photosites toward either end of the chip are spaced not at the usual pitch of 63.5 micrometers, but rather are bunched together slightly, for a pitch of 63.0 micrometers between the centers of adjacent photosites. For most of the 248 photosites, however, the usual pitch of 63.5 micrometers is maintained. Further, the edge photosites are spaced 31.25 micrometers from the edge. The purpose of this bunching of the five end photosites at either end of the chip is to accommodate the squeezing in of 248 reasonably evenly spaced photosites within a slightly shorter chip of 15.743 mm, as opposed to the 15.748 mm of the chip 12. As a practical matter, this limited squeezing together of a relatively small subset of photosites on each chip is not significantly detrimental to the recording or creating of images with the chip. It is conceivable that the shorter chip such as 112 could distribute the needed shortening across the entire set of repetitive structures to maintain an even pitch across the chip 112, but the squeezing of only a small subset at either end of the chip has been found satisfactory. Indeed, the short pitches could be made apparent toward the middle photosites of the chip instead of at the end photosites.

As described above, the effective length of chips 12 or 112 is basically determined by the spacing between the main V-grooves which are etched into the original wafer 100 to form the particular chip. Such grooves, which act as a guide for the cutting blade when the wafer 100 is diced into individual chips, can be placed on the wafer 100 with extremely high precision, through photolithographic etching, as is known in the art. According to the present invention, the V-grooves at the ends of the short chips 112 are deliberately spaced closer together than the corresponding grooves for the regular chips 12. However, in the dicing process, the action of the mechanical dicing blade presents a source of uncertainty in the intended length of the resulting chips 12 or 112. This imprecision can be taken into account with statistical techniques.

Figure 8:
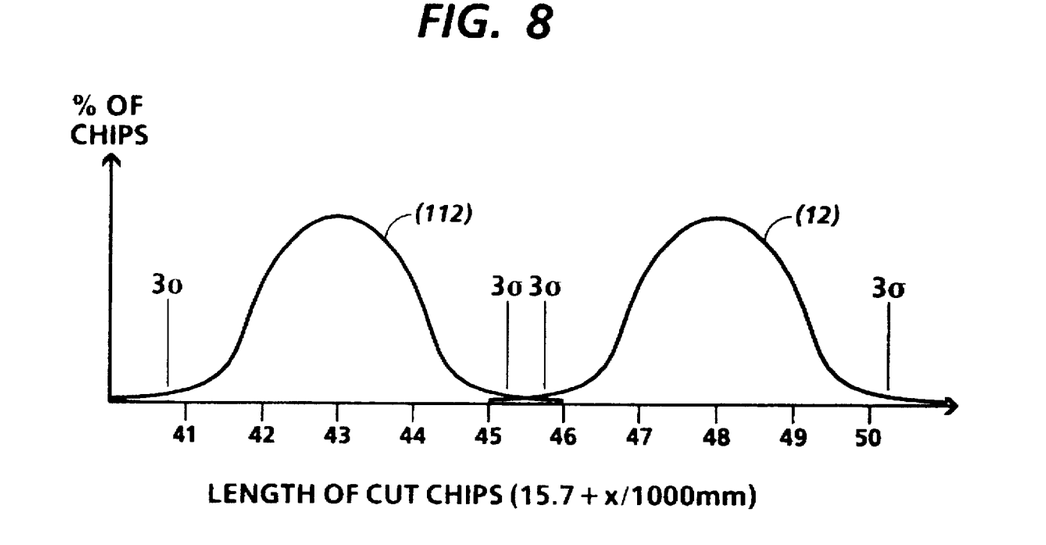
FIG. 8 is a graph showing statistical distributions of relatively long and short chips made according to one aspect of the present invention.

FIG. 8 is an example of a graph showing the distribution of actual measured lengths of mechanically-diced chips from a wafer such as 100. As can be seen, the distribution indicated as (12), which indicates the distribution of chips of a given length for chips 12, is a normal distribution with the mode thereof centered around the intended length of 15.748 mm, as shown in FIG. 7A. The distribution curve (112), which corresponds to the distribution of actual lengths of chips 112 in FIG. 7B, is similarly a normal distribution with the mode thereof around the optimal length of 15.743 mm. The actual shapes of the respective distribution curves will ultimately depend on the precision of the mechanical dicing process, although it is here assumed an identical mechanical dicing process will be performed for both chips 12 and 112, resulting in the same statistical variance for each distribution.

According to a preferred embodiment of the present invention, the respective modes for the long chips 12 and the short chips 112, which corresponds to the location of the original etched V-grooves formed photolithographically in the wafer, should be so chosen that, given the normal distributions of the actual long and short chips, the upper $3\sigma$ for the shorter chips is not more than the lower $3\sigma$ for the distribution of the longer chips. The selection of the desired modes, which will determine the intended spacing of the V-grooves for the long and short chips, will depend intimately on the variance of chip lengths created by a particular mechanical dicing technique.

The particular reason that the upper $3\sigma$ of the shorter chip should be equal to or less than the lower $3\sigma$ of the distribution for the longer chip is that, even in a basic case where there is one intended length of a chip, chips which deviate by more $3\sigma$ from the mode are too disruptive of the spacing of chips in the chip array, and will in any case be discarded. By separating the modes of the long and short chips as shown in FIG. 8, a minimum number of chips need be discarded at least for the reason of being more than $3\sigma$ away from the mode.

While the invention has been described with reference to the structure disclosed, it is not confined to the details set forth, but is intended to cover such modifications or changes as may come within the scope of the following claims.

We claim:

1. A chip array for use in imaging apparatus, comprising:

a substrate;

a plurality of semiconductor chips attached to the substrate, each semiconductor chip including on a main surface thereof an equal number of repetitive structures arranged in a linear array extending along a main dimension;

a first chip of the plurality of semiconductor chips being of a first type, chips of the first type having a first set of repetitive structures thereon, wherein the first set of repetitive structures arranged in the linear array define a first total length; and a second chip of the plurality of semiconductor chips being of a second type, chips of the second type having a second set of repetitive structures thereon, wherein the second set of repetitive structures arranged in the linear array define a second total length shorter than the first total length.

2. The array of claim 1, a subset of repetitive structures in the semiconductor chip of the second type being spaced closer together than a corresponding subset of structures in the semiconductor chip of the first type.

3. The array of claim 1, the repetitive structures of the plurality of semiconductor chips forming a single linear array.

4. The array of claim 1, comprising a plurality of semiconductor chips of the first type, lengths of the semiconductor chips of the first type along the main dimension forming a distribution having a median; and a length of a semiconductor chip of the second type along the main dimension being more than 0.002 mm shorter than said median.

5. The array of claim 1, each repetitive structure including a photosensor.

6. The array of claim 1, each repetitive structure including a light-emitting diode.

7. The array of claim 1, each repetitive structure including a portion of an ink-jet ejector.

* * * * *